(12) United States Patent
Brese et al.

(10) Patent No.: US 8,585,885 B2
(45) Date of Patent: Nov. 19, 2013

(54) ELECTROCHEMICALLY DEPOSITED INDIUM COMPOSITES

(75) Inventors: Nathaniel E. Brese, Farmingdale, NY (US); Edit Szocs, Lucerne (CH); Felix J. Schwager, Meggen (CH); Michael P. Toben, Smithtown, NY (US); Martin W. Bayes, Hopkinton, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 1228 days.

(21) Appl. No.: 12/229,746

(22) Filed: Aug. 26, 2008

(65) Prior Publication Data
US 2009/0075102 A1    Mar. 19, 2009

Related U.S. Application Data

(60) Provisional application No. 60/966,433, filed on Aug. 28, 2007.

(51) Int. Cl.
*C25D 15/00* (2006.01)

(52) U.S. Cl.
USPC .......................................... 205/109; 205/261

(58) Field of Classification Search
CPC .............. C25D 3/30; C25D 3/32; C25D 3/34; C25D 3/36; C25D 3/54
USPC .......... 205/109, 110, 238, 261, 299, 300–303
See application file for complete search history.

(56) References Cited

U.S. PATENT DOCUMENTS

| | | | | |
|---|---|---|---|---|
| 3,642,589 | A * | 2/1972 | Nobel et al. | 205/242 |
| 4,022,585 | A * | 5/1977 | Kaye | 428/551 |
| 4,043,878 | A * | 8/1977 | Ehrsam | 205/109 |
| 4,617,096 | A * | 10/1986 | Kuhn et al. | 205/251 |
| 5,607,570 | A | 3/1997 | Rohbani | |
| 6,197,282 | B1 | 3/2001 | Oshima et al. | |
| 6,635,166 | B2 | 10/2003 | Saji et al. | |
| 6,653,741 | B2 | 11/2003 | Sreeram et al. | |
| 6,797,758 | B2 | 9/2004 | Misra et al. | |
| 6,847,699 | B2 | 1/2005 | Rigali et al. | |
| 6,866,764 | B2 | 3/2005 | Dalman et al. | |
| 7,023,089 | B1 | 4/2006 | Lu | |
| 2004/0217009 | A1 * | 11/2004 | Mikkola et al. | 205/296 |
| 2004/0249177 | A1 * | 12/2004 | Wang et al. | 549/563 |
| 2005/0040369 | A1 | 2/2005 | Lalena et al. | |
| 2005/0061496 | A1 | 3/2005 | Matabayas, Jr. | |
| 2005/0269726 | A1 | 12/2005 | Matabayas, Jr. | |
| 2006/0067852 | A1 | 3/2006 | Suh et al. | |
| 2006/0244148 | A1 | 11/2006 | Lu | |

FOREIGN PATENT DOCUMENTS

| | | |
|---|---|---|
| EP | 0 339 464 | 11/1989 |
| EP | 1 111 097 B1 | 7/2006 |
| JP | 2942823 | 8/1999 |

OTHER PUBLICATIONS

Ed. Stuart M. Lee, "Ceramic Fiber Composites Based Upon Refractory Polycrystalline Ceramic Matrices", Composites Technology, CRC Press, ISBN 0877625646, 1989, pp. 117-118.
Product Data Sheet of Indium Corporation of America, "Indium Sulfamate Plating Bath".

* cited by examiner

*Primary Examiner* — Nicholas A Smith
*Assistant Examiner* — Ciel Thomas
(74) *Attorney, Agent, or Firm* — John J. Piskorski

(57) ABSTRACT

Electrochemically deposited indium composites are disclosed. The indium composites include indium metal or an alloy of indium with one or more ceramic materials. The indium composites have high bulk thermal conductivities. Articles containing the indium composites also are disclosed.

9 Claims, No Drawings

ELECTROCHEMICALLY DEPOSITED INDIUM COMPOSITES

The present invention is directed to electrochemically deposited indium composites with high thermal conductivity. More specifically, the present invention is directed to electrochemically deposited indium composites with high thermal conductivity for thermal interface materials.

Thermal interface materials (TIMs) are critical to protect electronic devices such as integrated circuits (IC) and active semiconductor devices, such as microprocessors, from exceeding their operational temperature limit. They enable bonding of the heat generating device (e.g. a silicon semiconductor) to a heat sink or a heat spreader (e.g. copper and aluminum components) without creating an excessive thermal barrier. The TIM may also be used in the assembly of other components of the heat sink or the heat spreader stack that composes the overall thermal impedance path.

Formation of an efficient thermal path is an important property of TIMs. The thermal path can be described in terms of effective thermal conductivity through the TIM. The effective thermal conductivity of the TIM is primarily due to the integrity of the interface between the TIMs and the heat spreader thermal conductivity as well as the (intrinsic) bulk thermal conductivity of the TIM. A variety of other properties are also important for a TIM depending on the particular application, for example: an ability to relax thermal expansion stresses when joining two materials (also referred to as "compliance"), an ability to form a mechanically sound joint that is stable during thermal cycling, a lack of sensitivity to moisture and temperature changes, manufacturing feasibility and cost.

Several classes of materials are being used as TIMs, for example, thermal greases, thermal gels, adhesives, elastomers, thermal pads, and phase change materials. Although the foregoing TIMs have been adequate for many semiconductor devices, the increased performance of semiconductor devices has rendered such TIMs inadequate. Thermal conductivity of many current TIMs does not exceed 5 W/mK and many are less than 1 W/mK. However, TIMs that form thermal interfaces with effective thermal conductivities exceeding 15 W/mK are presently needed. The higher the thermal conductivity of the TIM the more efficient is the heat transfer from the semiconductor devices.

An alternative to the foregoing TIMs are metals, solders and their alloys which have low melting temperatures and that have high thermal conductivities. For example, indium has a low melting temperature of 156° C. and a thermal conductivity of ~82 W/mK. Metal TIMs such as indium may also exhibit a favorable solder or wetting behavior upon reflow which facilitates a low thermal interfacial resistance. During reflow the solder and substrate are heated, the solder melts and wets by surface tension and local surface alloying. The interfaces consist of intermetallics or interdiffused metals with thermal properties that are frequently less desirable than those of the bulk TIM metal but better than polymer based TIMs. In many cases bulk TIM metals are subjected to reflow in order to form reliable thermal interfaces.

An example of indium for a TIM is disclosed in U.S. Pat. No. 6,653,741 to Sreeram et al. The indium is used as a binder material for a solder. However, solder application often results in the formation of air bubbles and voids. This results in poor interface between the solder and the substrate. Further, solder pastes generally contain high levels of contaminants which can degrade the thermal performance of solder-based TIMs. In general, solder pastes fail to provide a uniform thermal conductivity. Accordingly, there is still a need for indium TIMs with substantially uniform high thermal conductivities and with desirable interface properties.

In one aspect compositions include one or more sources of indium ions and one or more ceramic materials.

In another aspect methods include providing a composition including one or more sources of indium ions and one or more ceramic materials; and electrochemically depositing an indium composite on a substrate.

In a further aspect composites include indium metal and a uniform dispersion of one or more ceramic materials, the compositions have a thermal conductivity of at least 80 W/mK.

In an additional aspect articles include a die joined on a first side to a base, a second side of the die opposite the first side comprises a thermal interface material comprising indium metal and a substantially uniform dispersion of one or more ceramic materials, the thermal interface material has a thermal conductivity of at least 80 W/mK.

The electrochemically deposited indium composites have substantially uniform bulk thermal conductivities of at least 80 W/mK, thus provide efficient heat transfer, and are highly desirable for use as TIMs in semiconductor devices from which large amounts of heat must be dissipated. The electrochemically deposited high thermal conductivity indium composites prevent such devices from exceeding their operational temperature limits. The electrochemically deposited indium composites form uniform interfaces with their substrates which also adds to the efficient heat transfer from the semiconductor devices. Bubble formation and voids, which are typical of many solder based TIMs, are avoided.

An additional benefit of electrochemically deposited indium composites is that they contain less indium than a pure metallic solder on a volume basis. Indium is the most expensive component of the composite, thus minimizing its use provides a less expensive alternative to metallic solders.

As used throughout the specification, the following abbreviations have the following meanings, unless the context clearly indicates otherwise: ° C.=degrees Centigrade; ° K=degrees Kelvin; g=gram; mg=milligram; L=liter; m=meter; A=amperes; dm=decimeter; μm=micron=micrometer; nm=nanometers; ppm=parts per million; ppb=parts per billion; mm=millimeter; $cm^3$=cubic centimeter; M=molar; MEMS=micro-electro-mechanical systems; TIM=thermal interface material; CTE=coefficient of thermal expansion; IC=integrated circuits; HLB=hydrophilic/lipophilic balance; and EO=ethylene oxide.

The terms "depositing" and "plating" are used interchangeably throughout this specification. The term "copolymer" is a compound composed of two or more mers. All amounts are percent by weight and all ratios are by weight, unless otherwise noted. All numerical ranges are inclusive and combinable in any order except where it is logical that such numerical ranges are constrained to add up to 100%.

Indium composites include indium metal or an indium alloy and a substantially uniform dispersion of one or more ceramic materials, the indium composites have bulk thermal conductivities of at least 80 W/mK. The indium composites are electrochemically deposited from aqueous compositions onto substrates and may be used as TIMs. Such composites may also find utility as hermetic seals, interconnects and adhesives.

The aqueous compositions include one or more sources of indium ions which are soluble in an aqueous environment. Such sources include, but are not limited to, indium salts of alkane sulfonic acids and aromatic sulfonic acids, such as methanesulfonic acid, ethanesulfonic acid, butane sulfonic acid, benzenesulfonic acid and toluenesulfonic acid, salts of sulfamic acid, sulfate salts, chloride and bromide salts of indium, nitrate salts, hydroxide salts, indium oxides, fluoroborate salts, indium salts of carboxylic acids, such as citric acid, acetoacetic acid, glyoxylic acid, pyruvic acid, glycolic acid, malonic acid, hydroxamic acid, iminodiacetic acid, salicylic acid, glyceric acid, succinic acid, malic acid, tartaric acid, hydroxybutyric acid, indium salts of amino acids, such as arginine, aspartic acid, asparagine, glutamic acid, glycine, glutamine, leucine, lysine, threonine, isoleucine, and valine. Typically, the source of indium ions is one or more indium salts of sulfuric acid, sulfamic acid, alkane sulfonic acids, aromatic sulfonic acids and carboxylic acids. More typically, the source of indium ions is one or more indium salts of sulfuric acid and sulfamic acid.

The water-soluble salts of indium are included in the compositions in sufficient amounts to provide an indium composite deposit of desired thickness. Typically the water-soluble indium salts are included in the compositions to provide indium ($3^+$) ions in the compositions in amounts of 5 g/L to 70 g/L, or such as from 10 g/L to 60 g/L, or such as from 15 g/l to 30 g/L.

One or more ceramic materials are included in the aqueous compositions as particles or solid fibers or mixtures of particles and fibers. The particles may be spherical, plates or acicular. The ceramic particles range in size from 30 nm to 20 µm or such as from 0.5 µm to 10 µm. The solid fibers range from 25 nm to 10 µm thick, or such as from 50 nm to 100 nm thick. The length of the solid fibers ranges from 50 µm to 2 mm, or such as from 100 µm to 300 µm. Particles and solid fibers of such sizes provide particle to particle or fiber to fiber interfaces which optimize the transport of thermal conductivity across the indium composite.

Ceramic materials include, but are not limited to, diamond, graphite, ceramic oxides, ceramic carbides, ceramic nitrides, ceramic borides, ceramic silicides and intermetallics. Typically, the ceramic materials include diamond, graphite, silicon carbide, aluminum oxides, barium oxides, beryllium oxides, calcium oxides, cobalt oxides, chromium oxides, dysprosium oxides and other rare earth oxides, hafnium oxides, lanthanum oxides, magnesium oxides, manganese oxides, niobium oxides, nickel oxides, tin oxides, aluminum phosphate, yttrium phosphate, lead oxides, lead titanate, lead zirconate, silicon oxides and silicates, thorium oxides, titanium oxides and titanates, uranium oxides, yttrium oxides, yttrium aluminate, zirconium oxides and their alloys, boron carbides, iron carbides, hafnium carbides, molybdenum carbides, silicon carbides, tantalum carbides, titanium carbides, uranium carbides, tungsten carbides, zirconium carbides, aluminum nitrides, cubic boron nitrides, hexagonal boron nitrides, hafnium nitride, silicon nitrides, titanium nitrides, uranium nitrides, yttrium nitrides, zirconium nitrides, aluminum boride, hafnium boride, molybdenum boride, titanium boride, zirconium boride and molybdenum disilicide. More typically, the ceramic materials are diamond, graphite, silicon carbide, ceramic nitrides and ceramic oxides. Most typically, the ceramic materials are diamond, graphite, silicon carbide, aluminum nitride and aluminum oxide.

When the ceramic material is in the form of solid fibers, the ceramic material typically is diamond, graphitic carbon, silicon carbide or boron nitride. Typically, the ceramic material is graphitic carbon or silicon carbide. Most typically, the solid fibers are graphitic carbon.

Ceramics are included in the aqueous compositions in sufficient amounts to provide an indium composite having a thermal conductivity of at least 80 W/mK. Typically ceramics are included in the aqueous compositions in amounts of 0.01 g/L to 50 g/L or such as from 0.5 g/L to 30 g/L, or such as from 1 g/L to 20 g/L or such as from 5 g/l to 10 g/L.

One or more dispersants may be added to the aqueous compositions to maintain a uniform dispersion of the ceramics during electrochemical deposition. Dispersants include, but are not limited to, silicone dispersants, such as modified silicones and reactive silicones, polyalkoxylated ethers, glycol ethers and cationic surface-active agents. Such dispersants are included in the aqueous compositions in amounts of 1 g/L to 80 g/L or such as from 5 g/L to 60 g/L or such as from 10 g/L to 40 g/L.

Modified silicones include, but are not limited to, polyether-modified silicones, alkyl-aralkyl-modified silicones, alkyl-aralkyl-polyether-modified silicones, alkyl-higher alcohol-modified silicones, alcohol-modified silicones, fluoro-modified silicones, fluoroalkyl-modified silicones, alkylene oxide-modified silicones, alkylene oxide-modified silicone copolymers, silphenylene-modified silicone copolymers, ethylene-modified silicone copolymers, α-methylstyrene-modified silicone copolymers, carborane-modified silicone copolymers, bisphenol A carbonate-modified silicone copolymers and alkoxysilane-modified silicone copolymers.

Reactive silicones include, but are not limited to, oxazoline-modified silicones, amino-modified silicones, amino-polyether-modified silicones, epoxy-modified silicones, epoxy-polyether-modified silicones, carboxyl-modified silicones, carboxyl-polyether-modified silicones, carbinol-modified silicones, mercapto-modified silicones, phenol-modified silicones, vinyl-modified silicones and hydroxy-modified silicones.

Polyalkoxylated ethers include, but area not limited to, polyoxyethylene alkyl phenyl ethers, such as polyoxyethylene octyl phenyl ether and polyoxyethylene nonyl phenyl ether, polyoxyethylene alkyl ethers, such as polyoxyethylene dodecyl ether and polyoxyethylene alkyl ($C_{12}$ to $C_{16}$) ethers. Glycol ethers include, but are not limited to, propylene glycol methyl ether, dipropylene glycol methyl ether and propylene glycol phenyl ether.

Cationic surface-active agents include, but are not limited to, alkyl- or phenyl ammonium salts, alkylamine oxides and polysaccharides.

Typically, dispersants have an HLB of at least 1. More typically, dispersants have an HLB of 2 to 15, or such as from 3 to 7.

In addition to one or more sources of indium ions, one or more ceramic materials, and one or more dispersants, the aqueous compositions also may include one or more additives. Such additives include, but are not limited to, one or more buffers, hydrogen suppressors, surfactants, levelers, chelating agents, carriers, alloying metals and other conventional additives used in indium electrochemical compositions.

Buffers or conducting salts included in the indium compositions may be one or more acids to provide a pH of 0 to 5, typically a pH of 0.5 to 3, more typically 1 to 1.5. Such acids include, but are not limited to, alkane sulfonic acids, aryl sulfonic acids, such as methanesulfonic acid, ethanesulfonic acid, benzenesulfonic acid, toluenesulfonic acid, sulfamic acid, sulfuric acid, hydrochloric acid, hydrobromic acid, fluoroboric acid, boric acid, carboxylic acids such as citric acid, acetoacetic acid, glyoxylic acid, pyruvic acid, glycolic acid, malonic acid, hydroxamic acid, iminodiacetic acid, salicylic acid, glyceric acid, succinic acid, malic acid, tartaric acid, and hydroxybutyric acid, amino acids, such as arginine, aspartic acid, asparagine, glutamic acid, glycine, glutamine, leucine, lysine, threonine, isoleucine and valine. One or more corresponding salts of the acids also may be used. Typically, one or more alkane sulfonic acids, aryl sulfonic acids and carboxylic acids are used as buffers or conducting salts. More typically, one or more alkane sulfonic acids and aryl sulfonic acids or their corresponding salts are used.

Buffers or conducting salts are used in sufficient amounts to provide the desired pH of the compositions. Typically, the buffers or conducting salts are used in amounts of 5 g/L to 50 g/L, or such as from 10 g/L to 40 g/L, or such as from 15 g/L to 30 g/L of the compositions.

One or more hydrogen suppressors may be included in the aqueous indium compositions to suppress hydrogen gas formation during indium metal deposition. Hydrogen suppressors are compounds which drive the potential for water decomposition, the source of hydrogen gas, to a more cathodic potential such that indium metal may deposit without the simultaneous evolution of hydrogen gas. This increases the current efficiency for indium deposition at the cathode and enables formation of indium layers which are smooth and uniform in appearance and also permits the formation of thicker indium layers than many conventional indium electrochemical baths. This process may be shown using cyclic voltammetry (CV) investigation well known in the art and literature. Typically, aqueous indium electrochemical baths which do not include one or more hydrogen suppressors form indium deposits that are rough and uneven in appearance and the cathode efficiency is low. Such deposits are unsuitable for use in electronic devices.

The hydrogen suppressors are epihalohydrin copolymers. Epihalohydrins include epichlorohydrin and epibromohydrin. Typically, copolymers of epichlorohydrin are used. Such copolymers are water-soluble polymerization products of epichlorohydrin or epibromohydrin and one or more organic compounds which includes nitrogen, sulfur, oxygen atoms or combinations thereof.

Nitrogen-containing organic compounds copolymerizable with epihalohydrins include, but are not limited to:

1) aliphatic chain amines;
2) unsubstituted heterocyclic nitrogen compounds having at least two reactive nitrogen sites; and,
3) substituted heterocyclic nitrogen compounds having at least two reactive nitrogen sites and having 1-2 substitution groups chosen from alkyl groups, aryl groups, nitro groups, halogens and amino groups.

Aliphatic chain amines include, but are not limited to, dimethylamine, ethylamine, methylamine, diethylamine, triethyl amine, ethylene diamine, diethylenetriamine, propylamine, butylamine, pentylamine, hexylamine, heptylamine, octylamine, 2-ethylhexylamine, isooctylamine, nonylamine, isononylamine, decylamine, undecylamine, dodecylaminetridecylamine and alkanol amines.

Unsubstituted heterocyclic nitrogen compounds having at least two reactive nitrogen sites include, but are not limited to, imidazole, imidazoline, pyrazole, 1,2,3-triazole, tetrazole, pyridazine, 1,2,4-triazole, 1,2,3-oxadiazole, 1,2,4-thiadiazole and 1,3,4-thiadiazole.

Substituted heterocyclic nitrogen compounds having at least two reactive nitrogen sites and having 1-2 substitutions groups include, but are not limited to, benzimidazole, 1-methylimidazole, 2-methylimidazole, 1,3-dimethylimidazole, 4-hydroxy-2-amino imidazole, 5-ethyl-4-hydroxyimidazole, 2-phenylimidazoline and 2-tolylimidazoline.

Typically, one or more compounds chosen from imidazole, pyrazole, imidazoline, 1,2,3-triazole, tetrazole, pyridazine, 1,2,4-triazole, 1,2,3-oxadiazole, 1,2,4-thiadiazole and 1,3,4-thiadiazole and derivatives thereof which incorporate 1 or 2 substituents chosen from methyl, ethyl, phenyl and amino groups are used to form the epihalohydrin copolymer.

Some of the epihalohydrin copolymers are commercially available such as from Raschig GmbH, Ludwigshafen Germany and from BASF, Wyandotte, Mich., USA, or may be made by methods disclosed in the literature, such as in U.S. Pat. No. 5,607,570. Other commercial sources include Wuhan Fengfan Chemical, Columbia Chemical and Mahavair.

The epihalohydrin copolymers are included in the compositions in amounts of 5 g/L to 100 g/L. Typically, epihalohydrin copolymers are included in amounts of 10 g/L to 80 g/L, more typically, they are included in amounts of 20 g/L to 70 g/L, most typically in amounts of 30 g/L to 60 g/L.

Any surfactant which is compatible with the other components of the compositions may be used. Typically, the surfactants are reduced foaming or non-foaming surfactants. Such surfactants include, but are not limited to, non-ionic surfactants such as ethoxylated polystyrenated phenol containing 12 moles of EO, ethoxylated butanol containing 5 moles of EO, ethoxylated butanol containing 16 moles of EO, ethoxylated butanol containing 8 moles of EO, ethoxylated octanol containing 12 moles of EO, ethoxylated octylphenol containing 12 moles of EO, ethoxylated/propoxylated butanol, ethoxylated beta-naphthol containing 13 moles of EO, ethoxylated beta-naphthol containing 10 moles of EO, ethoxylated bisphenol A containing 10 moles of EO, ethoxylated bisphenol A containing 13 moles of EO, sulfated ethoxylated bisphenol A containing 30 moles of EO and ethoxylated bisphenol A containing 8 moles of EO. Such surfactants are included in conventional amounts. Typically, they are included in the compositions in amounts of 0.1 g/L to 20 g/l, or such as from 0.5 g/L to 10 g/L. They are commercially available and may be prepared from methods disclosed in the literature.

Other surfactants include, but are not limited to, amphoteric surfactants such as alkyldiethylenetriamine acetic acid and quaternary ammonium compounds and amines. Such surfactants are well known in the art and many are commercially available. They may be used in conventional amounts. Typically they are included in the compositions in amounts of 0.1 g/L to 20 g/L, or such as from 0.5 g/L to 10 g/L. Typically, the surfactants used are quaternary ammonium compounds.

Chelating agents include, but are not limited to, carboxylic acids, such as malonic acid and tartaric acid, hydroxy carboxylic acids, such as citric acid and malic acid and salts thereof. Stronger chelating agents, such as ethylenediamine tetraacetic acid (EDTA) also may be used. The chelating agents may be used alone or combinations of the chelating agents may be used. For example, varying amounts of a relatively strong chelating agent, such as EDTA can be used in combination with varying amounts of one or more weaker chelating agents such as malonic acid, citric acid, malic acid and tartaric acid to control the amount of indium which is available for electroplating. Chelating agents may be used in conventional amounts. Typically, chelating agents are used in amounts of 0.001 M to 3M.

Levelers include, but are not limited to, polyalkylene glycol ethers. Such ethers include, but are not limited to, dimethyl polyethylene glycol ether, di-tertiary butyl polyethylene glycol ether, polyethylene/polypropylene dimethyl ether (mixed or block copolymers), and octyl monomethyl polyalkylene ether (mixed or block copolymer). Such levelers are included in conventional amounts. Typically such levelers are included in amounts of 100 ppb to 500 ppb.

Carriers include, but are not limited to, phenanthroline and its derivatives, such as 1,10-phenantroline, triethanolamine and its derivatives, such as triethanolamine lauryl sulfate, sodium lauryl sulfate and ethoxylated ammonium lauryl sulfate, polyethyleneimine and its derivatives, such as hydroxypropylpolyeneimine (HPPEI-200), and alkoxylated polymers. Such carriers are included in the indium compositions in conventional amounts. Typically, carriers are included in amounts of 200 ppm to 2000 ppm.

One or more alloying metals include, but are not limited to, aluminum, bismuth, copper, gold, nickel, silver, tin, tungsten and zinc. Typically the alloying metals are gold, bismuth, silver and tin. More typically, gold and tin are the alloying metals. The alloying metals may be added to the indium compositions as water soluble metal salts. Such water soluble metal salts are well known. Many are commercially available or may be prepared from descriptions in the literature. Water soluble metal salts are added to the indium compositions in amounts sufficient to form an indium alloy having 1 wt % to 5 wt %, or such as from 2 wt % to 4 wt % of an alloying metal. Typically, water soluble metal salts are added to the indium compositions in amounts such that the indium alloy has from 1 wt % to 3 wt % of an alloying metal.

Quantities of alloying metals in amounts of 3 wt % or less can improve TIM high temperature corrosion resistance and wetting and bonding to substrates such as silicon chips. Additionally, alloying metals such as silver, bismuth and tin can form low melting point eutectics with indium. Alloying metals may be included in the indium compositions in amounts of 0.01 g/L to 15 g/L, or such as 0.1 g/L to 10 g/L, or such as 1 g/L to 5 g/L.

The indium compositions may be used to deposit indium metal or indium alloy composite layers on a substrate. The composites are composed of indium metal or an indium alloy and particles of one or more ceramic material. The composites form uniform interfaces with the substrates. The purity of the indium metal may be as high as 99% by weight or higher unless an alloying metal is included. The thickness of the indium metal or alloy composite layers may vary. Typically the layers are 230 µm or less. More typically, the layers range from 50 µm to 230 µm or such as from 100 µm to 220 µm or such as from 140 µm to 210 µm.

The combination of the indium or indium alloy and the uniform dispersion of the ceramic particles in the composites provide indium and indium alloy composites with high uniform bulk thermal conductivities of at least 80 W/mK. Typically the thermal conductivities of the composites range from 80 W/mK to 350 W/mK or such as from 90 W/mK to 275 W/mK, or such as from 110 W/mK to 200 W/mK.

The composites include from 20 wt % to 90 wt % of indium or indium alloy and from 10 wt % to 80 wt % of uniformly dispersed ceramic particles. Uniformly dispersed means the average number of ceramic particles per unit volume is the same throughout the indium or indium alloy composite. The ceramic particles and fibers do not aggregate in isolated clumps in the composite. Accordingly, the thermal conductivity throughout the composite is uniform as well.

Apparatus used to deposit indium metal and indium alloy composites on a substrate may be conventional. An example of a plating apparatus which may be used is disclosed in EP0339464A1 and illustrated in FIGS. 5-7. Conventional electrodes may be used. Typically, soluble electrodes are used. More typically, soluble indium electrodes are used as anodes. The substrate to be plated with the indium composite is the cathode or working electrode. Any suitable reference electrode may be used, if required. Typically, the reference electrode is a silver chloride/silver electrode. The aqueous composition is continuously stirred during electrochemical deposition using conventional stirring apparatus. Current densities may range from 0.5 $A/dm^2$ to 50 $A/dm^2$, or such as from 1 $A/dm^2$ to 25 $A/dm^2$, or such as from 10 $A/dm^2$ to 20 $A/dm^2$.

The temperatures of the aqueous indium compositions during electrochemical deposition range from 30° C. to 80° C. Typically, the temperatures range from 40° C. to 80° C.

The aqueous indium compositions may be used to deposit indium metal or indium alloy composites on a component for an electrical device to function as a TIM, such as for, but not limited to, ICs, microprocessors of semiconductor devices, MEMS and components for optoelectronic devices. Such electronic components may be included in printed wiring boards and hermetically sealed chip-scale and wafer-level packages. Such packages typically include an enclosed volume which is hermetically sealed, formed between a base substrate and lid, with the electronic device being disposed in the enclosed volume. The packages provide for containment and protection of the enclosed device from contamination and water vapor in the atmosphere outside the package. The presence of contamination and water vapor in the package can give rise to problems such as corrosion of metal parts as well as optical losses in the case of optoelectronic devices and other optical components. The bulk thermal conductivity of at least 80 W/mK and the uniform interface with the substrate enable the indium composites for use as TIMs. The indium composites remove heat from processing dies (i.e. resin enclosed silicon chips) and transfer the heat to lid/heat sinks. The indium composites may also take up stress induced by the mismatch of the CTE between different materials which are joined together in electronic devices.

In one embodiment an indium metal or indium alloy composite layer is electrochemically deposited on a surface of a processing die substrate to function as a TIM and a heat sink is joined to the processing die by means of the indium metal or indium alloy composite layer. The heat sink may be of a conventional material such as nickel coated copper, silicon carbide or aluminum. The processing die may be joined to a printed wiring board base or ceramic base by means of solder bumps, which are on a side of the processing die opposite to that of the indium metal or alloy composite layer. The solder bumps may be composed of conventional materials such as tin or tin alloys or other conventional materials used in the electronics industry. The solder bumps also may be of electrochemically deposited indium metal or indium alloy.

In another embodiment an indium metal or indium alloy composite layer is electrochemically deposited on a surface of a processing die substrate to function as a TIM and a concave lid (i.e. a top portion with continuous sides perpendicular to the top portion) which covers the processing die and is placed over the die and indium metal or alloy composite layer. The lid may have a conventional design (i.e. rectangular or elliptical) and may be of conventional materials, such as copper or copper alloy. The indium or indium alloy composite layer joins the lid to the die. The processing die is joined to a printed wiring board base or ceramic base by means of solder bumps. Solder bumps at bottom surfaces of the sides of the concave lid join the lid to the printed wiring board base or ceramic base.

In a further embodiment an indium metal or indium alloy composite layer is electrochemically deposited on a surface of a heat spreader to function as a TIM. The heat spreader and lid may be of conventional materials, such as copper, copper alloys, silicon carbide or composites of metals and ceramics, such as aluminum or copper infused silicon carbide. The indium metal or indium alloy composite layer joins the lid to the die.

In an additional embodiment an indium metal composite layer is electrochemically deposited on a surface of a processing die substrate to function as a TIM and a concave lid (i.e. a top portion with continuous sides perpendicular to the top portion) which covers the processing die and is placed over the die and indium metal layer. The lid may have a conventional design (i.e. rectangular or elliptical) and may be of conventional materials. The indium composite layer joins the lid to the die. The processing die is joined to a printed wiring board base or ceramic base by means of solder bumps. Solder bumps at bottom surfaces of the sides of the concave lid join the lid to the printed wiring board base or ceramic base. A second indium metal composite layer is electrochemically deposited on the top of the lid to function as a second TIM and a heat sink is joined to the top of the lid by means of the second indium metal composite layer.

In addition to depositing indium and indium alloy composites on the processing die substrate and heat spreader, indium and indium alloy composites may be deposited on the lid.

The following examples further illustrate the invention, but are not intended to limit the scope of the invention.

EXAMPLE I

The following aqueous indium electrochemical composition is prepared:

TABLE 1

| COMPONENT | AMOUNT |
|---|---|
| Indium (3+) ions (from indium sulfate) | 30 g/L |
| Ammonium hydroxide | 170 g/L |
| Boric acid | 80 g/L |
| Tataric acid | 300 g/L |
| Silicon carbide particles | 50 g/L |
| Mixture of polyether-modified silicones | 10 g/l |
| Phenyl ammonium salt | 5 g/L |
| pH | 3 |

The silicon carbide particles have an average size of 1 μm. The polyether-modified silicones are included in the composition to help maintain a uniform dispersion of the silicon carbide particles in the aqueous composition.

Five nickel coated copper ingots 10 cm×20 cm are plated with the indium composite. The apparatus for electrochemically depositing the indium composite is the apparatus disclosed in EP0339464A1. The indium electrochemical composition is maintained at a pH of 3 and a temperature of 60° C. The composition is continuously agitated during electroplating. Cathode current density is maintained at 10 A/dm$^2$. Electrochemical deposition continues until a 200 μm indium composite is deposited on the ingots.

The indium composites are expected to form a uniform interface with the ingots and the indium composites are expected to adhere to the ingots when tested for adhesion using the ASTM B905-00(2005) standard test method for metallic and inorganic coatings. The indium composites are expected to have a uniform distribution of silicon carbide particles and a uniform thermal conductivity of at least 80 W/mK.

EXAMPLE II

The following aqueous indium electrochemical composition is prepared:

TABLE 2

| COMPONENT | AMOUNT |
|---|---|
| Indium (3+) ions (from indium sulfate) | 60 g/L |
| Methane sulfonic acid | 30 g/L |
| Imidazole-epichlorohydrin copolymer | 100 g/L |
| Silicon carbide particles | 10 g/L |
| Mixture of epoxy-modified silicones | 12 g/L |
| pH | 1-1.2 |

The silicon carbide particles have an average size of 5 μm. The mixture of epoxy-modified silicones is included in the composition to help maintain a uniform dispersion of the silicon carbide particles in the aqueous composition.

Five nickel coated copper ingots 10 cm×20 cm are plated with the indium composite. The indium electrochemical composition is maintained at a pH of 1-1.2 and a temperature of 60° C. The composition is continuously agitated during electroplating. Cathode current density is maintained at 10 A/dm$^2$. Electrochemical deposition continues until a 230 μm indium composite is deposited on the ingots.

The indium composites are expected to form a uniform interface with the ingots and the indium composites are expected to adhere to the ingots when tested for adhesion using the ASTM B905-00(2005) standard test method for metallic and inorganic coatings. The indium composites are expected to have a uniform distribution of silicon carbide particles and a uniform thermal conductivity of at least 80 W/mK as measured by the ASTM E1225-99 standard test method for solids.

EXAMPLE III

The following aqueous indium electrochemical composition is prepared:

TABLE 3

| COMPONENT | AMOUNT |
|---|---|
| Indium (3+) ions (from indium sulfate) | 60 g/L |
| Methane sulfonic acid | 30 g/L |
| Imidazole-epichlorohydrin copolymer | 100 g/L |
| Diamond particles | 15 g/L |
| Mixture of vinyl-modified silicones | 12 g/L |
| Propylene glycol phenyl ether | 5 g/L |
| pH | 1 |

The diamond particles have an average size of 10 μm. The mixture of vinyl-modified silicones and propylene glycol phenyl ether are added to the composition to help maintain a uniform dispersion of the diamond particles during plating.

Five aluminum ingots 10 cm×20 cm are plated with the indium composite. The indium electrochemical composition is maintained at a pH of 1 and a temperature of 50° C. The composition is continuously agitated during electroplating. Cathode current density is maintained at 20 A/dm$^2$. Electrochemical deposition continues until a 200 μm indium composite is deposited on the aluminum ingots.

The indium composites are expected to form a uniform interface with the ingots and the indium composites are expected to adhere to the ingots when tested for adhesion using the ASTM B905-00(2005) standard test method for metallic and inorganic coatings. The indium composites are expected to have a uniform distribution of diamond particles and a uniform thermal conductivity of at least 80 W/mK as measured by the ASTM E1225-99 standard test method for solids.

EXAMPLE IV

The following aqueous indium electrochemical composition is prepared:

TABLE 4

| COMPONENT | AMOUNT |
|---|---|
| Indium ($3^+$) ions (from indium sulfate) | 60 g/L |
| Methane sulfonic acid | 30 g/L |
| Imidazole-epichlorohydrin copolymer | 80 g/L |
| Graphite particles | 10 g/L |
| Mixture of carboxy-modified silicones | 15 g/L |
| Polyoxyethylene octyl phenyl ether | 5 g/L |
| pH | 1 |

The graphite particles have an average size of 5 μm. The mixture of carboxy-modified silicones and polyoxyethylene octyl phenyl ether are added to the composition to help maintain a uniform dispersion of the graphite particles during plating.

Five aluminum ingots 10 cm×20 cm are plated with the indium composite. The indium electrochemical composition is maintained at a pH of 1 and a temperature of 50° C. The composition is continuously agitated during electroplating. Cathode current density is maintained at 5 A/dm². Electrochemical deposition continues until a 150 μm indium composite is deposited on the aluminum ingots.

The indium composites are expected to form a uniform interface with the ingots and the indium composites are expected to adhere to the ingots when tested for adhesion using the ASTM B905-00(2005) standard test method for metallic and inorganic coatings. The indium composites are expected to have a uniform distribution of graphite particles and a uniform thermal conductivity of at least 80 W/mK as measured by the ASTM E1225-99 standard test method for solids.

EXAMPLE V

The following aqueous indium electrochemical composition is prepared:

TABLE 5

| COMPONENT | AMOUNT |
|---|---|
| Indium ($3^+$) ions (from indium sulfate) | 60 g/L |
| Methane sulfonic acid | 30 g/L |
| Imidazole-epichlorohydrin copolymer | 80 g/L |
| Aluminum nitride particles | 15 g/L |
| Mixture of carborane-modified silicone copolymers | 10 g/L |
| Dipropylene glycol methyl ether | 5 g/L |
| pH | 1 |

The aluminum nitride particles have an average size of 8 μm. The mixture of carborane-modified silicone copolymers and dipropylene glycol methyl ether are added to the composition to help maintain a uniform dispersion of the aluminum nitride particles during plating.

Five aluminum ingots 10 cm×20 cm are plated with the indium composite. The apparatus for electrochemically depositing the indium composite is conventional. The indium electrochemical composition is maintained at a pH of 1 and a temperature of 55° C. The composition is continuously agitated during electroplating. Cathode current density is maintained at 1 A/dm². Electrochemical deposition continues until a 100 μm indium composite is deposited on the aluminum ingots.

The indium composites are expected to form a uniform interface with the ingots and the indium composites are expected to adhere to the ingots when tested for adhesion using the ASTM B905-00(2005) standard test method for metallic and inorganic coatings. The indium composites are expected to have a uniform distribution of aluminum nitride particles and a uniform thermal conductivity of at least 80 W/mK as measured by the ASTM E1225-99 standard test method for solids.

EXAMPLE VI

The following aqueous indium electrochemical composition is prepared:

TABLE 6

| COMPONENT | AMOUNT |
|---|---|
| Indium ($3^+$) ions (from indium sulfate) | 50 g/L |
| Methane sulfonic acid | 30 g/L |
| Imidazole-epichlorohydrin copolymer | 80 g/L |
| Aluminum nitride particles | 15 g/L |
| Mixture of alcohol-modified silicone copolymers | 10 g/L |
| Polyoxyethylene dodecyl ether | 5 g/L |
| pH | 2 |

The aluminum nitride particles have an average size of 10 μm. The mixture of alcohol-modified silicones and polyoxyethylene dodecyl ether are added to the composition to help maintain a uniform dispersion of the aluminum nitride particles during plating.

Five chemical vapor deposited silicon carbide tablets 10 cm×20 cm are plated with the indium composite. The indium electrochemical composition is maintained at a pH of 2 and a temperature of 50° C. The composition is continuously agitated during electroplating. Cathode current density is maintained at 5 A/dm². Electrochemical deposition continues until a 150 μm indium composite is deposited on the silicon carbide tablets.

The indium composites are expected to form a uniform interface with the tablets and the indium composites are expected to adhere to the tablets when tested for adhesion using the ASTM B905-00(2005) standard test method for metallic and inorganic coatings. The indium composites are expected to have a uniform distribution of aluminum nitride particles and a uniform thermal conductivity of at least 80 W/m° K. as measured by the ASTM E1225-99 standard test method for solids.

EXAMPLE VII

The following aqueous indium alloy electrochemical composition is prepared:

TABLE 7

| COMPONENT | AMOUNT |
|---|---|
| Indium ($3^+$) ions (from indium sulfate) | 50 g/L |
| Methane sulfonic acid | 30 g/L |
| Imidazole-epichlorohydrin copolymer | 80 g/L |
| Tin ($2^+$) ions (from tin sulfonate) | 20 g/L |
| Silicon carbide particles | 15 g/L |

TABLE 7-continued

| COMPONENT | AMOUNT |
|---|---|
| Mixture of mercapto-modified silicones | 10 g/L |
| Mixture of polyoxyethylene alkyl ($C_{12}$-$C_{16}$) ethers | 5 g/L |
| pH | 1 |

The silicon carbide particles have an average size of 2 μm. The mixture of mercapto-modified silicones and polyoxyethylene alkyl($C_{12}$-$C_{16}$) ethers are added to the composition to help maintain a uniform dispersion of the silicon carbide particles during plating.

Five sintered silicon carbide tablets 10 cm×20 cm are plated with the indium/tin alloy composite. The indium/tin alloy electrochemical composition is maintained at a pH of 1 and a temperature of 50° C. The composition is continuously agitated during electroplating. Cathode current density is maintained at 10 A/dm². Electrochemical deposition continues until a 200 μm indium/tin alloy composite is deposited on the silicon carbide tablets.

The indium/tin alloy composites are expected to form a uniform interface with the tablets and the composites are expected to adhere to the tablets when tested for adhesion using the ASTM B905-00(2005) standard test method for metallic and inorganic coatings. The composites are expected to have a uniform distribution of silicon carbide particles and a uniform thermal conductivity of at least 80 W/mK as measured by the ASTM E1225-99 standard test method for solids.

EXAMPLE VIII

The following aqueous indium alloy electrochemical composition is prepared:

TABLE 8

| COMPONENT | AMOUNT |
|---|---|
| Indium (3⁺) ions (from indium sulfate) | 40 g/L |
| Methane sulfonic acid | 30 g/L |
| Imidazole-epichlorohydrin copolymer | 80 g/L |
| Zinc (2⁺) ions (from zinc sulfate monohydrate) | 5 g/L |
| Graphitic carbon fibers | 10 g/L |
| Polyoxyethylene dodecyl ether | 15 g/L |
| pH | 1 |

The solid graphitic carbon fibers have an average length of 200 μm and an average thickness of 250 nm. The polyoxyethylene dodecyl ether is added to the composition to help maintain a uniform dispersion of the solid graphitic carbon fibers during plating.

Five sintered silicon carbide tablets 10 cm×20 cm are plated with the indium/zinc alloy composite. The indium/zinc alloy electrochemical composition is maintained at a pH of 1 and a temperature of 50° C. The composition is continuously agitated during electroplating. Cathode current density is maintained at 10 A/dm². Electrochemical deposition continues until a 100 μm indium/zinc alloy composite is deposited on the silicon carbide tablets.

The indium/zinc alloy composites are expected to form a uniform interface with the tablets and the composites are expected to adhere to the tablets when tested for adhesion using the ASTM B905-00(2005) standard test method for metallic and inorganic coatings. The composites are expected to have a uniform distribution of solid graphitic carbon fibers and a uniform thermal conductivity of at least 80 W/mK as measured by the ASTM E1225-99 standard test method for solids.

EXAMPLE IX

The following aqueous indium/copper alloy electrochemical composition is prepared:

TABLE 9

| COMPONENT | AMOUNT |
|---|---|
| Indium (3⁺) ions (from indium sulfate) | 55 g/L |
| Methane sulfonic acid | 30 g/L |
| Imidazole-epichlorohydrin copolymer | 80 g/L |
| Copper (2⁺) ions (from copper sulfate pentahydrate) | 5 g/L |
| Diamond particles | 10 g/L |
| Propylene glycol methyl ether | 15 g/L |
| pH | 1 |

The diamond particles have an average size of 5 μm. The propylene glycol methyl ether is added to the composition to help maintain a uniform dispersion of the diamond particles during plating.

Five chemical vapor deposited silicon carbide tablets 10 cm×20 cm are plated with the indium/copper composite. The indium/copper alloy electrochemical composition is maintained at a pH of 1 and a temperature of 60° C. The composition is continuously agitated during electroplating. Cathode current density is maintained at 15 A/dm². Electrochemical deposition continues until a 200 μm indium/copper alloy composite is deposited on the silicon carbide tablets.

The indium/copper alloy composites are expected to form a uniform interface with the tablets and the composites are expected to adhere to the tablets when tested for adhesion using the ASTM B905-00(2005) standard test method for metallic and inorganic coatings. The composites are expected to have a uniform distribution of diamond particles and a uniform thermal conductivity of at least 80 W/mK as measured by the ASTM E1225-99 standard test method for solids.

EXAMPLE X

The following aqueous indium/copper alloy electrochemical composition is prepared:

TABLE 10

| COMPONENT | AMOUNT |
|---|---|
| Indium (3⁺) ions (from indium sulfate) | 55 g/L |
| Methane sulfonic acid | 30 g/L |
| Imidazole-epichlorohydrin copolymer | 80 g/L |
| Copper (2⁺) ions (from copper sulfate pentahydrate) | 5 g/L |
| Diamond particles | 10 g/L |
| Propylene glycol methyl ether | 15 g/L |
| pH | 1 |

The diamond particles have an average size of 5 μm. The propylene glycol methyl ether is added to the composition to help maintain a uniform dispersion of the diamond particles during plating.

Five chemical vapor deposited silicon carbide tablets 10 cm×20 cm are plated with the indium/copper composite. The indium/copper alloy electrochemical composition is maintained at a pH of 1 and a temperature of 60° C. The composition is continuously agitated during electroplating. Cathode current density is maintained at 15 A/dm². Electrochemical deposition continues until a 200 μm indium/copper alloy composite is deposited on the silicon carbide tablets.

The indium/copper alloy composites are expected to form a uniform interface with the tablets and the composites are expected to adhere to the tablets when tested for adhesion using the ASTM B905-00(2005) standard test method for metallic and inorganic coatings. The composites are expected to have a uniform distribution of diamond particles and a uniform thermal conductivity of at least 80 W/mK as measured by the ASTM E1225-99 standard test method for solids.

EXAMPLE XI

The following aqueous indium/copper alloy electrochemical composition is prepared:

TABLE 11

| COMPONENT | AMOUNT |
| --- | --- |
| Indium ($3^+$) ions (from indium sulfate) | 55 g/L |
| Methane sulfonic acid | 30 g/L |
| Imidazole-epichlorohydrin copolymer | 80 g/L |
| Copper ($2^+$) ions (from copper sulfate pentahydrate) | 5 g/L |
| Diamond particles | 10 g/L |
| Propylene glycol methyl ether | 15 g/L |
| pH | 1 |

The diamond particles have an average size of 5 μm. The propylene glycol methyl ether is added to the composition to help maintain a uniform dispersion of the diamond particles during plating.

Five chemical vapor deposited silicon carbide tablets 10 cm×20 cm are plated with the indium/copper composite. The apparatus for electrochemically depositing the indium/copper alloy composite is conventional. The indium/copper alloy electrochemical composition is maintained at a pH of 1 and a temperature of 60° C. The composition is continuously agitated during electroplating. Cathode current density is maintained at 15 A/dm$^2$. Electrochemical deposition continues until a 200 μm indium/copper alloy composite is deposited on the silicon carbide tablets.

The indium/copper alloy composites are expected to form a uniform interface with the tablets and the composites are expected to adhere to the tablets when tested for adhesion using the ASTM B905-00(2005) standard test method for metallic and inorganic coatings. The composites are expected to have a uniform distribution of diamond particles and a uniform thermal conductivity of at least 80 W/mK as measured by the ASTM E1225-99 standard test method for solids.

EXAMPLE XII

The following aqueous indium/gold alloy electrochemical composition is prepared:

TABLE 12

| COMPONENT | AMOUNT |
| --- | --- |
| Indium ($3^+$) ions (from indium sulfate) | 55 g/L |
| Methane sulfonic acid | 30 g/L |
| Imidazole-epichlorohydrin copolymer | 80 g/L |
| Gold ($3^+$) ions (from potassium tetracyanoaurate) | 5 g/L |
| Silicon carbide particles | 10 g/L |
| Mixture of carbinol-modified silicones | 15 g/L |
| pH | 1 |

The silicon carbide particles have an average size of 1 μm. The carbinol-modified silicones are added to the composition to help maintain a uniform dispersion of the silicon carbide particles during plating.

Five chemical vapor deposited silicon carbide tablets 10 cm×20 cm are plated with the indium/gold composite. The apparatus for electrochemically depositing the indium/gold alloy composite is conventional. The indium/gold alloy electrochemical composition is maintained at a pH of 1 and a temperature of 60° C. The composition is continuously agitated during electroplating. Cathode current density is maintained at 20 A/dm$^2$. Electrochemical deposition continues until a 200 μm indium/gold alloy composite is deposited on the silicon carbide tablets.

The indium/gold alloy composites are expected to form a uniform interface with the tablets and the composites are expected to adhere to the tablets when tested for adhesion using the ASTM B905-00(2005) standard test method for metallic and inorganic coatings. The composites are expected to have a uniform distribution of silicon carbide particles and a uniform thermal conductivity of at least 80 W/mK as measured by the ASTM E1225-99 standard test method for solids.

EXAMPLE XIII

The following aqueous indium/bismuth alloy electrochemical composition is prepared:

TABLE 13

| COMPONENT | AMOUNT |
| --- | --- |
| Indium ($3^+$) ions (from indium sulfate) | 60 g/L |
| Methane sulfonic acid | 30 g/L |
| Imidazole-epichlorohydrin copolymer | 80 g/L |
| Bismuth ($2^+$) ions (from bismuth ammonium citrate) | 10 g/L |
| Titanium dioxide particles | 10 g/L |
| Mixture of ethylene-modified silicone copolymers | 20 g/L |
| pH | 1 |

The titanium dioxide particles have an average size of 10 μm. The ethylene-modified silicone copolymers are added to the composition to help maintain a uniform dispersion of the titanium dioxide particles during plating.

Five nickel coated copper ingots 10 cm×20 cm are plated with the indium/bismuth composite. The indium/bismuth alloy electrochemical composition is maintained at a pH of 1 and a temperature of 60° C. The composition is continuously agitated during electroplating. Cathode current density is maintained at 15 A/dm$^2$. Electrochemical deposition continues until a 200 μm indium/bismuth alloy composite is deposited on the ingots.

The indium/bismuth alloy composites are expected to form a uniform interface with the ingots and the composites are expected to adhere to the ingots when tested for adhesion using the ASTM B905-00(2005) standard test method for metallic and inorganic coatings. The composites are expected to have a uniform distribution of titanium dioxide particles and a uniform thermal conductivity of at least 80 W/mK as measured by the ASTM E1225-99 standard test method for solids.

What is claimed is:
1. A method comprising:
   a) providing a composition consisting of one or more sources of indium ions, one or more epihalohydrin copolymers consisting of polymerization products of one or more epihalohydrins and one or more nitrogen-containing organic compounds, the one or more epihalohydrin copolymers are in amounts of 5-100 g/L, one or more ceramic materials, water, and optionally one or more additives selected from the group consisting of silicone dispersants, polyalkoxylated ethers, glycol ethers, buffers, conducting salts, chelating agents, levelers and carriers; and b) electrochemically depositing a composite comprising indium and the one or more ceramic materials on a substrate.

2. The method of claim 1, wherein the current density ranges from 0.5 A/dm² to 50 A/dm².

3. The method of claim 1, wherein the nitrogen-containing organic compounds are chosen from aliphatic chain amines, unsubstituted heterocyclic nitrogen compounds having at least two reactive nitrogen sites, and substituted heterocyclic nitrogen compounds having at least two reactive nitrogen sites and having 1-2 substitution groups chosen from alkyl groups, aryl groups, nitro groups, halogens and amino groups.

4. The method of claim 1, wherein the one or more ceramic materials are chosen from diamond, graphite, ceramic oxides, ceramic carbides, ceramic nitrides, ceramic borides, ceramic silicides and intermetallics.

5. A method comprising:
a) providing a composition consisting of one or more sources of indium ions, one or more epihalohydrin copolymers consisting of polymerization products of one or more epihalohydrins and one or more unsubstituted heterocyclic nitrogen compounds having at least two reactive nitrogen sites and substituted heterocyclic nitrogen compounds having at least two reactive nitrogen sites and having 1-2 substitution groups chosen from alkyl groups, aryl groups, nitro groups, halogens and amino groups, the one or more epihalohydrin copolymers are in amounts of 5-100 g/L, one or more ceramic materials, water, and optionally one or more additives selected from the group consisting of silicone dispersants, polyalkoxylated ethers, glycol ethers, buffers, conducting salts, chelating agents, levelers and carriers; and
b) electrochemically depositing a composite comprising indium and the one or more ceramic materials on a substrate.

6. The method of claim 3, wherein the unsubstituted heterocyclic nitrogen compounds having at least two reactive nitrogen sites are chosen from imidazole, imidazoline, pyrazole, 1,2,3-triazole, tetrazole, pyradazine, 1,2,4-triazole, 1,2,3-oxadiazole, 1,2,4-thiadiazole and 1,3,4-thiadiazole.

7. The method of claim 3, wherein the substituted heterocyclic nitrogen compounds having at least two reactive nitrogen sites and having 1-2 substitution groups are chosen from benzimidazole, 1-methylimidazole, 2-methylimidazole, 1,3-dimethylimidazole, 4-hydroxy-2-amino imidazole, 5-ethyl-4-hydroxyimidazole, 2-phenylimidazole and 2-tolylimidazoline.

8. The method of claim 1, wherein the one or more sources of indium ions are in amounts of 10 g/L to 70 g/L.

9. The method of claim 1, wherein pH is from 0 to 5.

* * * * *